(12) United States Patent
Wang

(10) Patent No.: US 12,250,774 B2
(45) Date of Patent: Mar. 11, 2025

(54) ENGAGING CONNECTION STRUCTURE AND ENGAGING CONNECTION METHOD THEREOF

(71) Applicant: FIVEGRAND INTERNATIONAL CO., LTD., New Taipei (TW)

(72) Inventor: Ting-Jui Wang, New Taipei (TW)

(73) Assignee: FIVEGRAND INTERNATIONAL CO., LTD., New Taipei (TW)

( * ) Notice: Subject to any disclaimer, the term of this patent is extended or adjusted under 35 U.S.C. 154(b) by 0 days.

(21) Appl. No.: 18/302,012

(22) Filed: Apr. 18, 2023

(65) Prior Publication Data

US 2024/0008236 A1 Jan. 4, 2024

(30) Foreign Application Priority Data

Jul. 4, 2022 (TW) .................................. 111124923

(51) Int. Cl.
| | | |
|---|---|---|
| F16B 37/04 | (2006.01) | |
| F16B 4/00 | (2006.01) | |
| F16B 5/02 | (2006.01) | |
| F16B 37/06 | (2006.01) | |
| H05K 1/18 | (2006.01) | |
| H05K 13/04 | (2006.01) | |

(52) U.S. Cl.
CPC ............ *H05K 13/04* (2013.01); *F16B 4/004* (2013.01); *F16B 5/0208* (2013.01); *F16B 37/068* (2013.01); *H05K 1/181* (2013.01); *H05K 2201/10189* (2013.01)

(58) Field of Classification Search
CPC ................... F16B 5/0208; F16B 4/004; H05K 2201/10303

USPC .......... 411/171, 174–176, 180; 292/248, 302
See application file for complete search history.

(56) References Cited

U.S. PATENT DOCUMENTS

| | | | | |
|---|---|---|---|---|
| 3,443,617 A | * | 5/1969 | Whiteside | F16B 37/067 |
| | | | | 411/181 |
| 6,068,307 A | * | 5/2000 | Murphy | G06F 1/1679 |
| | | | | 292/300 |
| 6,152,499 A | * | 11/2000 | Robert | E05B 65/0057 |
| | | | | 27/DIG. 1 |
| 6,364,377 B1 | * | 4/2002 | Ferguson | E05B 65/0057 |
| | | | | 27/DIG. 1 |
| 6,637,785 B2 | * | 10/2003 | Sugimoto | E05C 9/02 |
| | | | | 292/336.3 |
| 7,050,295 B2 | * | 5/2006 | Kang | G06F 1/162 |
| | | | | 361/679.55 |

(Continued)

FOREIGN PATENT DOCUMENTS

| | | |
|---|---|---|
| TW | 201339805 A | 10/2013 |
| TW | M509277 U | 9/2015 |

(Continued)

*Primary Examiner* — Gary W Estremsky

(57) ABSTRACT

The present disclosure provides an engaging connection structure and an engaging connection method thereof. The engaging connection structure includes at least one vertical insert portion and an assembly portion. The assembly portion is configured to be assembled at an object, and the vertical insert portion is configured for an insert to be inserted vertically therein. Thus, the engaging connection structure and the engaging connection method thereof of the present disclosure are enabled to provide a required object and an insert with a stable assembly effect.

11 Claims, 17 Drawing Sheets

(56) References Cited

U.S. PATENT DOCUMENTS

| | | | | |
|---|---|---|---|---|
| 7,354,080 | B2* | 4/2008 | Lee | E05C 1/10 |
| | | | | 361/679.55 |
| 7,425,026 | B1* | 9/2008 | Henderson | H02B 1/38 |
| | | | | 292/302 |
| 8,468,061 | B2* | 6/2013 | Sharma | G06Q 30/0224 |
| | | | | 705/7.29 |
| 10,968,942 | B1* | 4/2021 | Neidigk | F16B 37/14 |
| 11,255,897 | B2* | 2/2022 | Ghouse | H05K 3/301 |
| 11,333,190 | B1* | 5/2022 | Rice | F16B 37/122 |
| 2014/0035118 | A1* | 2/2014 | Bayerer | H01L 25/072 |
| | | | | 438/122 |
| 2018/0183206 | A1* | 6/2018 | Nishita | H01R 12/57 |
| 2018/0202482 | A1* | 7/2018 | Wu | F16B 19/109 |
| 2018/0258966 | A1* | 9/2018 | Wu | F16B 5/0266 |
| 2018/0347604 | A1* | 12/2018 | Bowers | F16B 5/10 |
| 2020/0103457 | A1* | 4/2020 | Ghouse | G01D 11/30 |
| 2020/0141464 | A1* | 5/2020 | Wang | F16B 21/065 |
| 2020/0208674 | A1* | 7/2020 | Wang | F16B 5/025 |
| 2021/0071701 | A1* | 3/2021 | Chiang | F16B 5/0208 |

FOREIGN PATENT DOCUMENTS

| | | |
|---|---|---|
| TW | M584842 U | 10/2019 |
| TW | I695124 B | 6/2020 |
| TW | 202224511 A | 6/2022 |

* cited by examiner

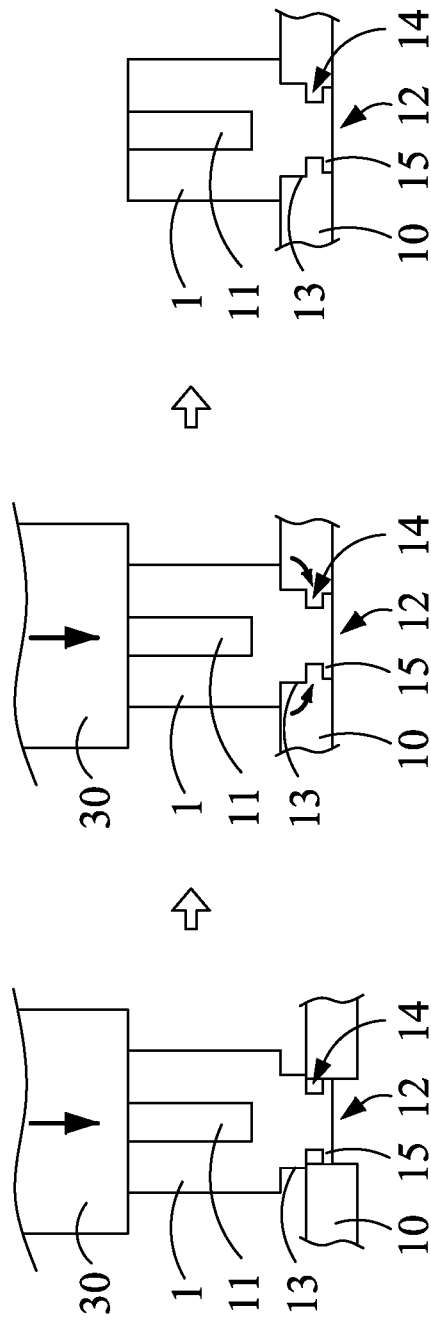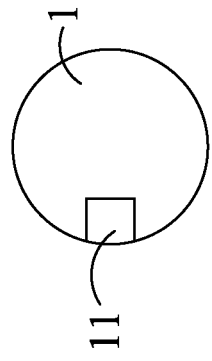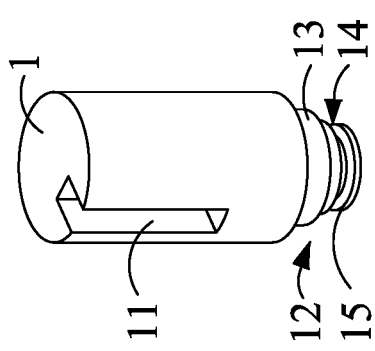

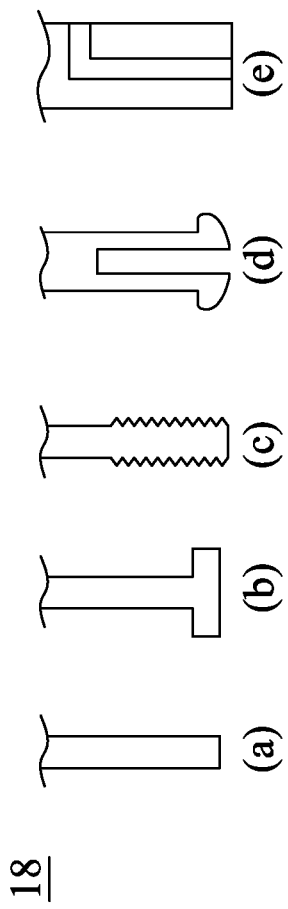
FIG. 19
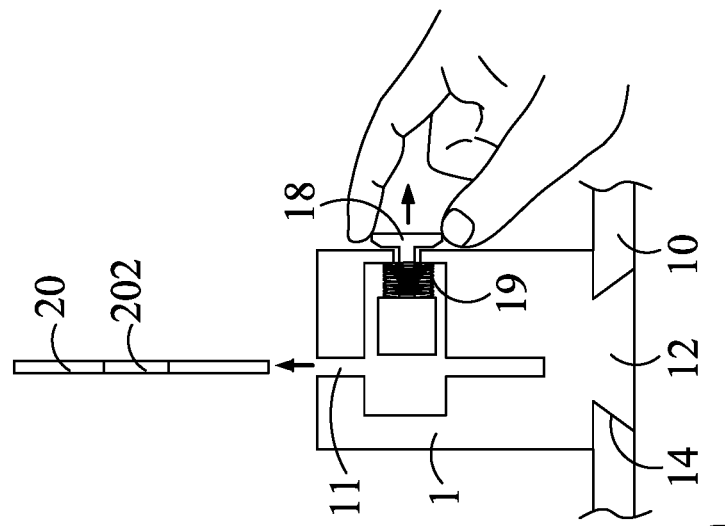
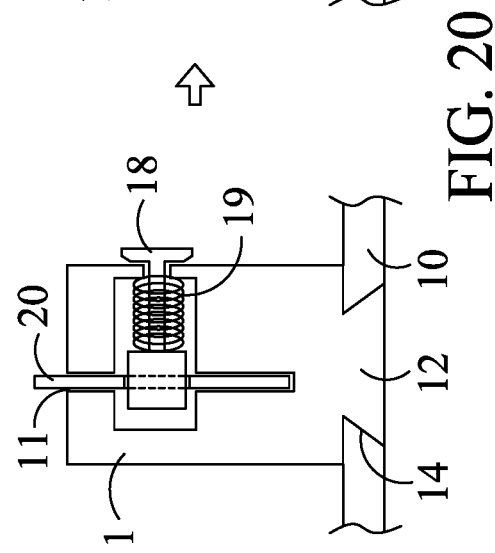
FIG. 20

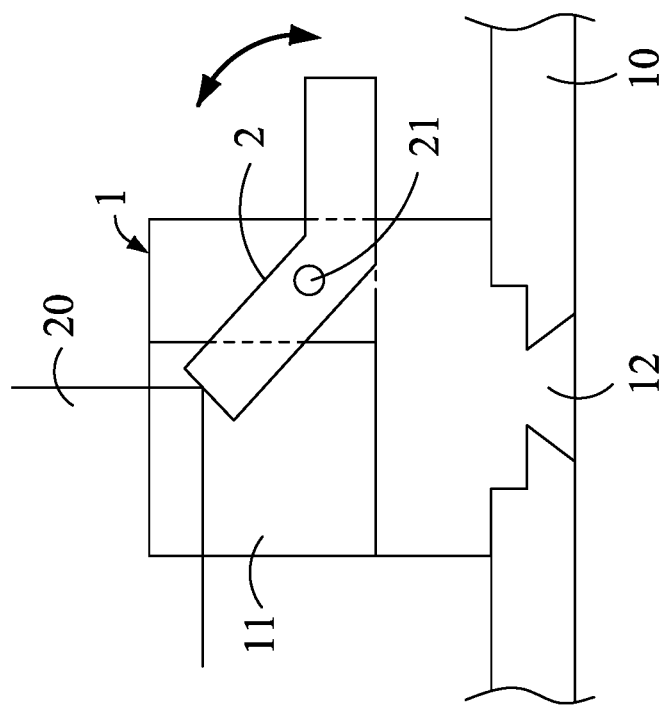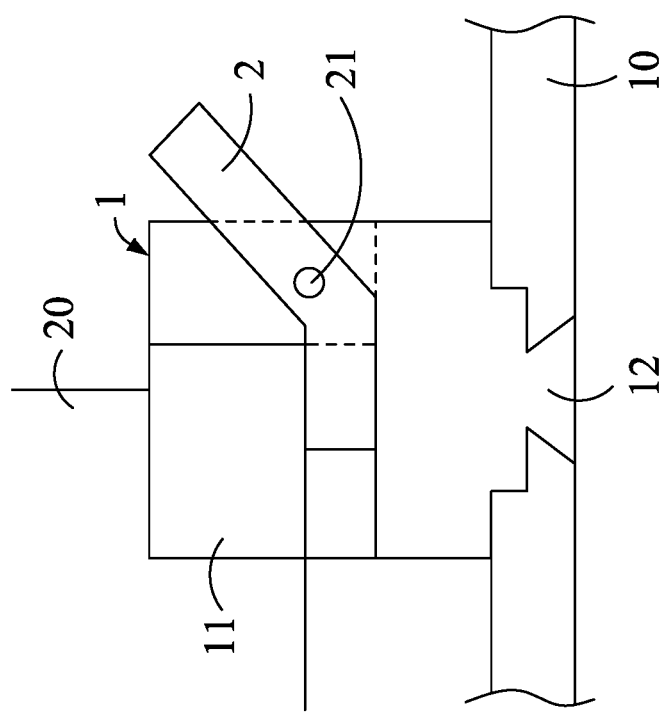
FIG. 21

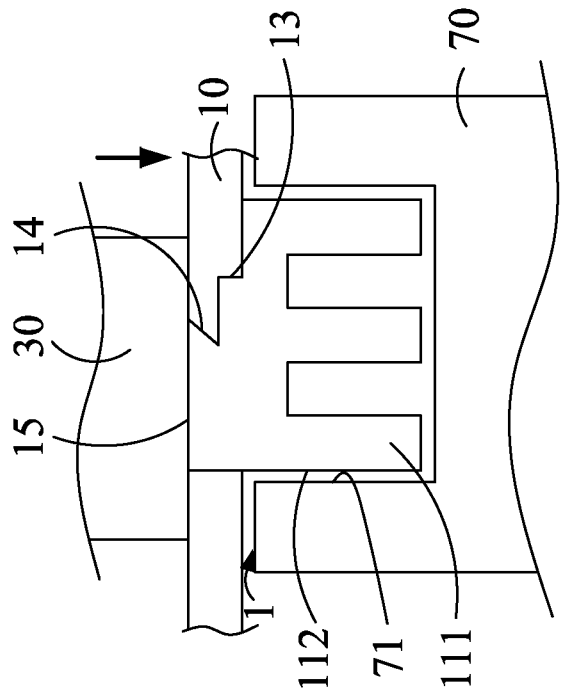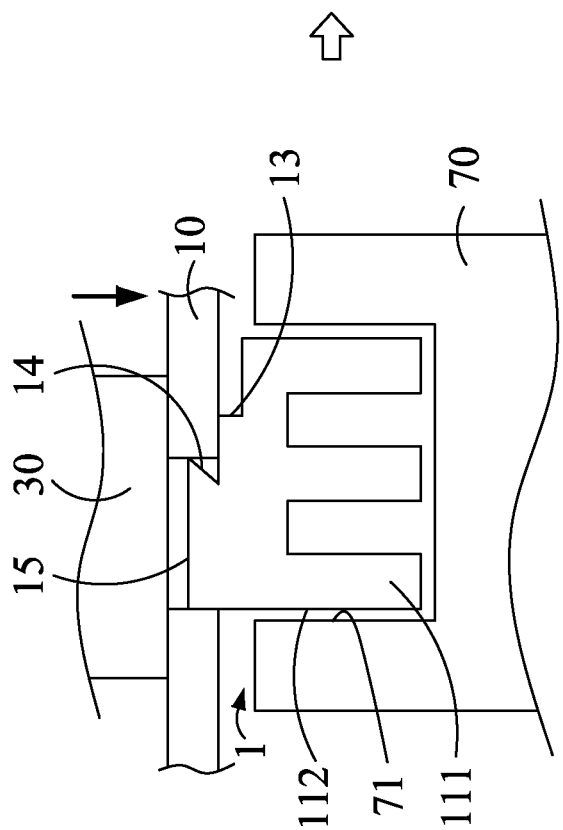
FIG. 23

ENGAGING CONNECTION STRUCTURE AND ENGAGING CONNECTION METHOD THEREOF

CROSS-REFERENCE TO RELATED APPLICATION

This non-provisional application claims priority under 35 U.S.C. § 119(a) on Patent Application No(s). 111124923 filed in Taiwan, R.O.C. on Jul. 4, 2022, the entire contents of which are hereby incorporated by reference.

BACKGROUND OF THE INVENTION

1. Field of the Invention

The present disclosure provides an engaging connection structure and an engaging connection method thereof, and in particular to an engaging connection structure and an engaging connection method thereof capable of providing a required object and an insert with stable assembly.

2. Description of the Related Art

When at least one object is to be coupled, a fixture is usually used for the coupling. However, due to a structural design of the fixture, a combined object may become unstable and even become loose.

BRIEF SUMMARY OF THE INVENTION

In view of the prior art above, the applicant has developed an engaging connection structure and an engaging connection method thereof, in the aim of achieving an object of providing a required object and an insert with stable assembly.

To achieve the above and other objects, the present disclosure provides an engaging connection structure and an engaging connection method thereof. The engaging connection structure includes at least one vertical insert portion and an assembly portion. The assembly portion is configured to be assembled at an object, and the vertical insert portion is configured for an insert to be inserted vertically therein.

The present disclosure further provides an engaging connection structure, which includes at least one horizontal insert portion configured for an insert to insert horizontally therein.

The present further provides an engaging connection method of the engaging connection structure. The method includes assembling the assembly portion at an object, or then inserting vertically an insert into the vertical insert portion, or assembling the engaging connection structure at an object and then inserting horizontally an insert into the horizontal insert portion.

In the above engaging connection structure and the engaging connection method thereof, the engaging connection structure further includes a pressurizing portion, a material storage space and a restricting portion. The pressurizing portion is configured to apply a pressure on an object to cause a material of the object to flow into or enter the material storage space, so as to restrict the engaging connection structure at the object by the restricting portion.

In the above engaging connection structure and the engaging connection method thereof, the object has a corresponding restricting portion, which correspondingly limits the restricting portion.

In the above engaging connection structure and the engaging connection method thereof, the object has a corresponding restricting portion. The corresponding restricting portion correspondingly limits the restricting portion as an anti-rotation of the engaging connection structure, so as to limit an engaging connection direction or position of the vertical insert portion.

In the above engaging connection structure and the engaging connection method thereof, the assembly portion is expandingly connected at the object.

In the above engaging connection structure and the engaging connection method thereof, the engaging connection portion further includes a rotating insert portion, and the vertical insert portion is in communication with the rotating insert portion.

In the above engaging connection structure and the engaging connection method thereof, the engaging connection portion further includes a rotating insert portion or another vertical insert portion, or the vertical insert portion is in communication with the rotating insert portion, or the rotating insert portion is in communication with the another vertical insert portion.

In the above engaging connection structure and the engaging connection method thereof, the engaging connection portion includes a plurality of vertical insert portions, which are arranged in a matrix.

In the above engaging connection structure and the engaging connection method thereof, the engaging connection portion further includes an engaging member, which is configured to be inserted into the insert.

In the above engaging connection structure and the engaging connection method thereof, the engaging member is a column, an outer fastener, a threaded body, an elastic fastener or an inner fastener.

In the above engaging connection structure and the engaging connection method thereof, the engaging member is movably assembled with the engaging connection structure.

In the above engaging connection structure and the engaging connection method thereof, the engaging member has an elastic element. One end of the elastic element presses against the engaging connection structure, and the other end of the elastic element presses against the engaging member.

In the above engaging connection structure and the engaging connection method thereof, the engaging connection structure is picked up by a picking tool. Once the engaging connection structure is picked up by the picking tool, a comparison device is provided to compare the engaging connection structure and an assembly position or an assembly distance of the object, the engaging connection structure is moved to the assembly position of the object by the picking tool according to comparison information of the comparison device, and the engaging connection structure is elastically pressed downward by the picking tool at the object or placed at the object, so that the engaging connection structure is assembled at the object via the assembly portion.

In the above engaging connection structure and the engaging connection method thereof, the object has a through hole, and the assembly portion of the engaging connection structure is assembled at the through hole of the object.

In the above engaging connection structure and the engaging connection method thereof, the object has a predetermined weldable layer, and the assembly portion has a weldable surface. The comparison device compares the weldable surface of the assembly portion and the position or distance of the predetermined weldable layer at the assembly position of the object, and the picking tool moves the engaging connection structure to the predetermined weldable layer of the object according to the comparison information of the comparison device.

In the above engaging connection structure and the engaging connection method thereof, the object is a circuit board, the object has a copper layer, and the predetermined weldable layer is provided at the copper layer.

In the above engaging connection structure and the engaging connection method thereof, the engaging connection portion further includes a rotating insert portion, or the vertical insert portion is in communication with the rotating insert portion, or the insert has a protrusion, or the protrusion is configured to be first inserted into the vertical insert portion and then horizontally or rotationally inserted into the rotating insert portion.

In the above engaging connection structure and the engaging connection method thereof, the insert includes an inserted portion, or the inserted portion is configured to be inserted by an engaging member.

In the above engaging connection structure and the engaging connection method thereof, the assembly portion includes a material storage space. The object is pressurized by a pressurizing portion to cause a material of the object to flow into or enter the material storage space, so as to restrict the engaging connection structure at the object by the restricting portion.

In the above engaging connection structure and the engaging connection method thereof, the insert enters a rotating insert portion horizontally or rotationally, and is then inserted into the vertical insert portion.

In the above engaging connection structure and the engaging connection method thereof, a protrusion of the insert enters a rotating insert portion horizontally or rotationally, and is then inserted into the vertical insert portion.

In the above engaging connection structure and the engaging connection method thereof, the engaging connection structure includes a push member, which presses against the insert.

In the above engaging connection structure and the engaging connection method thereof, the push member is arranged at the vertical insert portion by a bolted portion, so that the insert presses against the push member when inserted into the vertical insert portion, and the push member is moved to remove the insert from the vertical insert portion.

In the above engaging connection structure and the engaging connection method thereof, the engaging connection structure includes a body. The body is provided with a restricting portion, the restricting portion corresponds to a corresponding restricting portion of a mold, and the corresponding restricting portion and the restricting portion are configured for corresponding limiting or anti-rotation.

In the above engaging connection structure and the engaging connection method thereof, more than one engaging connection structure is configured for more than one insert to be inserted from one side or from multiple sides.

In the above engaging connection structure and the engaging connection method thereof, the assembly portion is configured to be pressurized by an object so that a material of the object is limited or fit connected at the assembly portion to restrict the engaging connection structure at the object by the assembly portion. Or, the engaging connection structure further includes a weldable surface, which is configured to be heated and welded so that the engaging connection structure is welded at the object. Or, the engaging connection structure further includes a lock connection portion or an engaging connection portion so that the engaging connection structure is assembled at the object.

In the above engaging connection structure and the engaging connection method thereof, the insert is a circuit board, a metal board, a plastic board, a board card, a printed circuit board (PCB), an M.2 card, an E1.S card, an NIC card, an integrated circuit (IC), a chip, a memory card, a cooling fin, cooling card, a heat sink, or an electronic device having a heat sink.

Thus, the engaging connection structure and the engaging connection method thereof of the present disclosure are capable of providing a required object and an insert with a stable assembly effect.

BRIEF DESCRIPTION OF THE DRAWINGS

FIG. 1 is a schematic diagram of an appearance of an engaging connection structure according to a first embodiment of the present disclosure.

FIG. 2 is a schematic diagram of an engaging connection structure in a top view state according to the first embodiment of the present disclosure.

FIG. 3 is a first schematic diagram of an engaging connection structure in the state of use according to the first embodiment of the present disclosure.

FIG. 19 is a schematic diagram of different forms of an engaging member of the present disclosure.

FIG. 20 is a schematic diagram of an engaging connection structure in a state of use according to an eleventh embodiment of the present disclosure.

FIG. 21 is a first schematic diagram of an engaging connection structure in a state of use according to a twelfth embodiment of the present disclosure.

FIG. 23 is a first schematic diagram of an engaging connection structure in a state of use according to a thirteenth embodiment of the present disclosure.

DETAILED DESCRIPTION OF THE INVENTION

Figure 4:
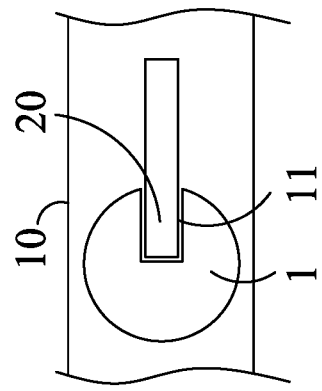
FIG. 4 is a second schematic diagram of an engaging connection structure in the state of use according to the first embodiment of the present disclosure.

To facilitate understanding of the object, characteristics and effects of this present disclosure, embodiments together with the attached drawings for the detailed description of the present disclosure are provided.

Refer to FIG. 1 to FIG. 6 showing an engaging connection structure of the present disclosure. The engaging connection structure 1 includes at least one vertical insert portion 11 and an assembly portion 12. The assembly portion 12 is configured to be assembled at an object 10, and the vertical insert portion 11 is configured for an insert 20 to be inserted vertically therein.

Figure 26:
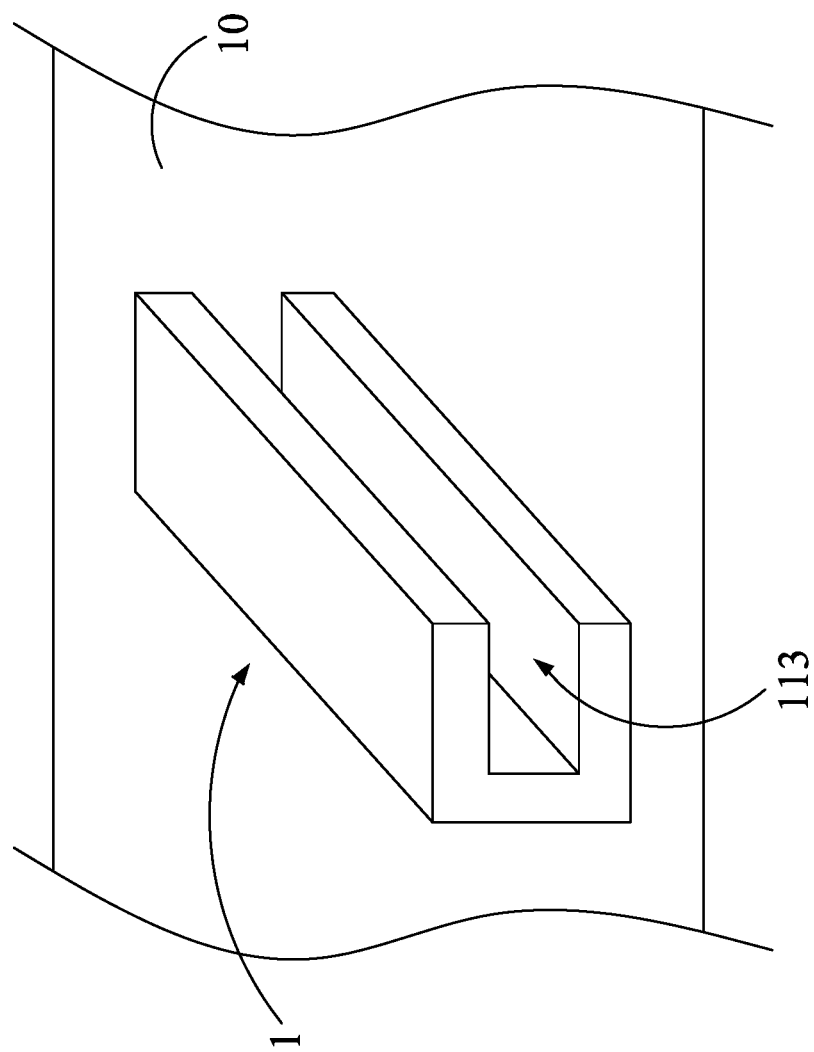
FIG. 26 is a first schematic diagram of an engaging connection structure in a state of use according to a fourteenth embodiment of the present disclosure.
Figure 27:
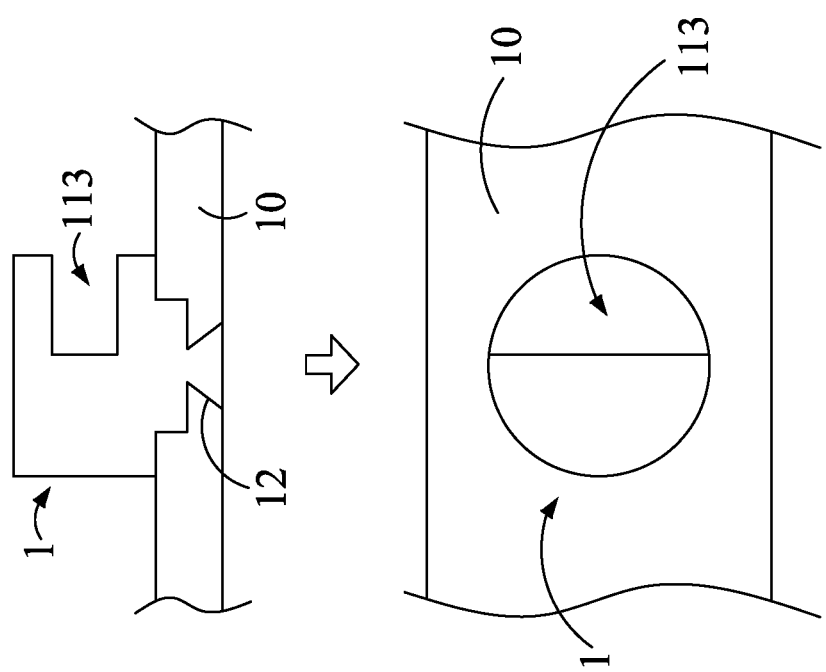
FIG. 27 is a second schematic diagram of an engaging connection structure in the state of use according to the fourteenth embodiment of the present disclosure.

In the engaging connection method of an engaging connection structure of the present disclosure, the assembly portion 12 may first be assembled at the object and the insert 20 is then inserted vertically into the vertical insert portion 11, so as to form a state of engaging connection or fit connection once then insert 20 is inserted into the vertical insert portion 11. Alternatively, as shown in FIG. 26 and FIG. 27, the assembly portion 12 may first be assembled at the object 10, and then the insert 20 is inserted horizontally into a horizontal insert portion 113 of the engaging connection structure 1, so as to form a state of engaging connection or fit connection once the insert 20 is inserted into the horizontal insert portion 113.

In one embodiment of the present disclosure, the engaging connection structure 1 further includes a pressurizing portion 13, a material storage space 14 and a restricting portion 15. The pressurizing portion 13 is configured to apply a pressure on the object 10 to cause a material of the object 10 to flow into or enter the material storage space 14, so as to restrict the engaging connection structure 1 at the object 10 by the restricting portion 15.

In one embodiment of the present disclosure, the material storage space 14 is provided at the assembly portion 11. The engaging connection structure 1 is pressurized by a mold 30 such that the object 10 is pressurized by the pressurizing portion 13, to cause the material of the object 10 to flow into or enter the material storage space 14, so as to restrict the engaging connection structure 1 at the object by the restricting portion 15 (as shown in FIG. 3).

In one embodiment of the present disclosure, the object 10 has a corresponding restricting portion 101. The corresponding restricting portion 101 correspondingly limits the restricting portion 15 as an anti-rotation of the engaging connection structure 1, so as to limit an engaging connection direction or position of the vertical insert portion 11 (as shown by parts a and b in FIG. 4).

Figure 5:
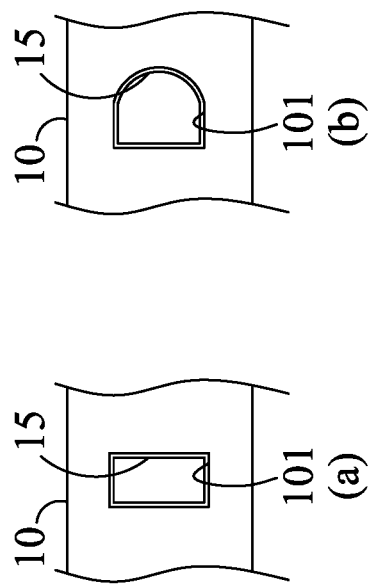
FIG. 5 is a third schematic diagram of an engaging connection structure in the state of use according to the first embodiment of the present disclosure.
Figure 6:
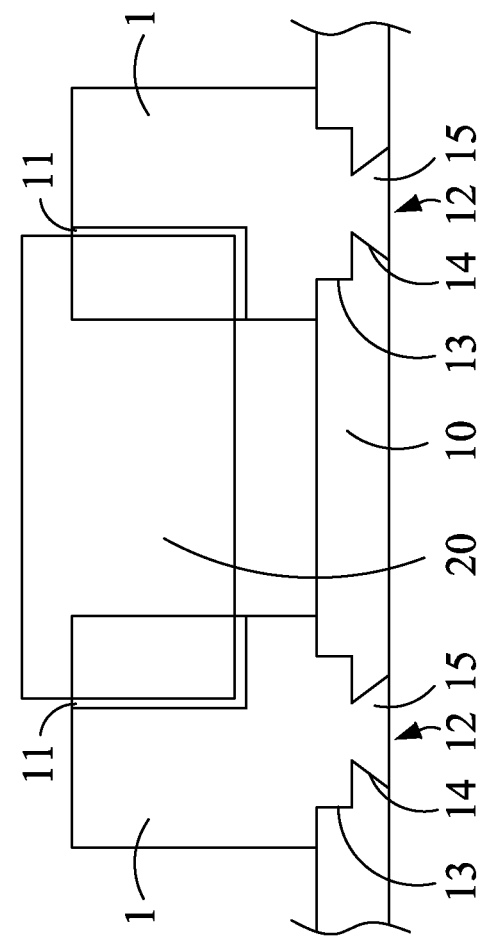
FIG. 6 is a fourth schematic diagram of an engaging connection structure in the state of use according to the first embodiment of the present disclosure.
Figure 7:
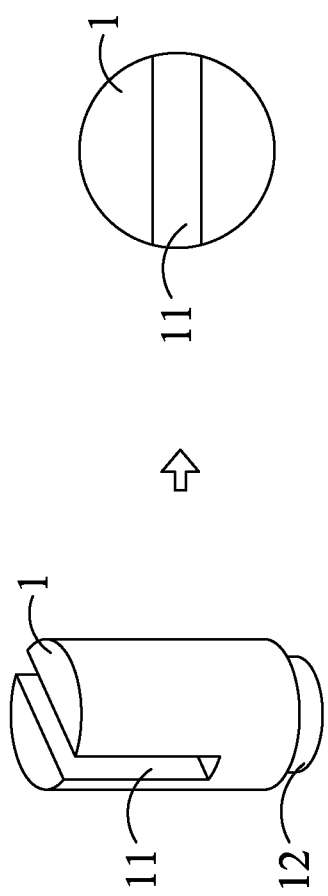
FIG. 7 is a schematic diagram of an engaging connection structure according to a second embodiment of the present disclosure.
Figure 8:
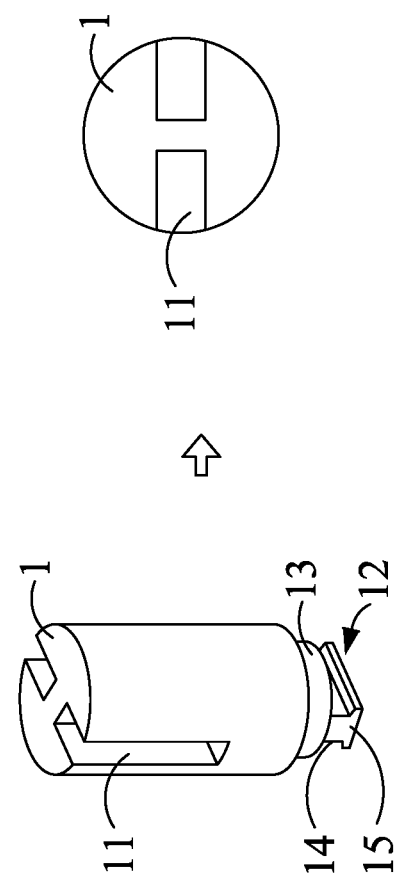
FIG. 8 is a schematic diagram of an appearance of an engaging connection structure according to a third embodiment of the present disclosure.

During use, one engaging connection structure 1 may be assembled at the object 10, and the insert 20 is vertically inserted into the vertical insert portion 11 (as shown in FIG. 5). Alternatively, two engaging connection structures 1 are assembled at the object 10, and the respective vertical insert portions 11 of the engaging connection structures 1 are configured to corresponding to each other, allowing two sides of the insert 20 to be inserted vertically into the vertical insert portions 11. Thus, the engaging connection structure 1 is enabled to provide the object 10 and the insert 20 with a stable assembly effect.

Moreover, in one embodiment of the present disclosure, the engaging connection structure 1 further includes a lock connection portion or an engaging connection portion configured to restrict the engaging connection structure 1 at the object 10.

As shown in FIG. 7 to FIG. 11, in one embodiment of the present disclosure, a difference from the above embodiments is that, the engaging connection structure 1 includes a plurality of vertical insert portions 11, which are in arranged in a matrix, wherein more than one engaging connection structure 1 can be inserted by more than one insert 20 from one side or from multiple sides.

Figure 9:
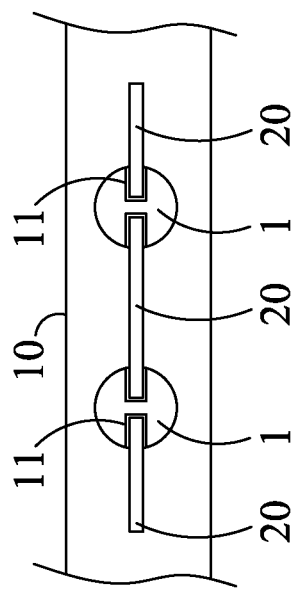
FIG. 9 is a schematic diagram of an engaging connection structure in a state of use according to the third embodiment of the present disclosure.
Figure 10:
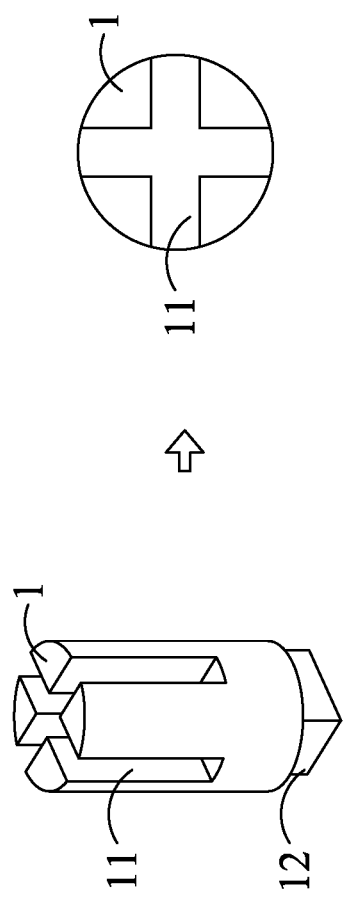
FIG. 10 is a schematic diagram of an engaging connection structure according to a fourth embodiment of the present disclosure.
Figure 11:
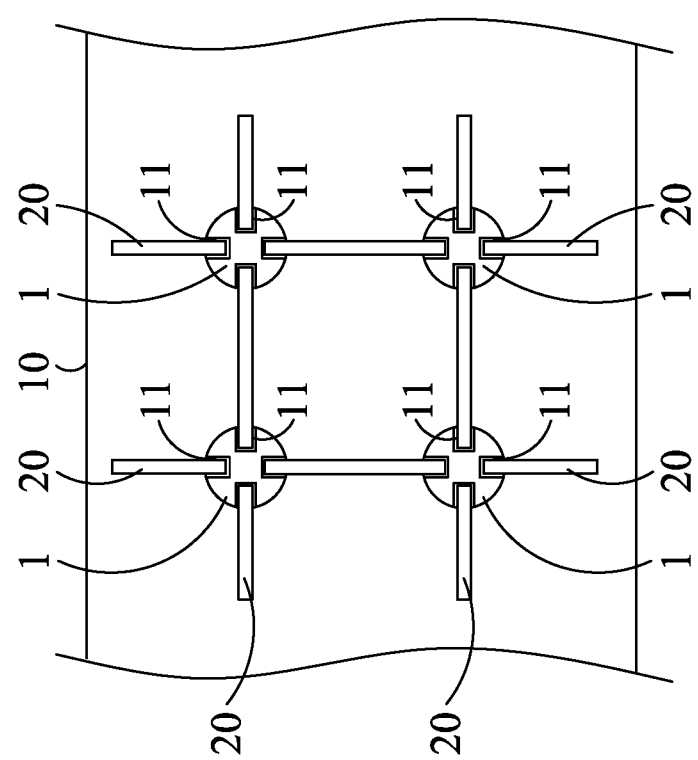
FIG. 11 is a schematic diagram of an engaging connection structure in a state of use according to the fourth embodiment of the present disclosure.

During use, two or more than two engaging connection structures 1 may be assembled at the object 10, allowing more than two inserts 20 to be inserted vertically into the vertical insert portions 11 (as shown in FIG. 9 and FIG. 11). Thus, the engaging connection structure 1 is enabled to provide the object 10 and the plurality of inserts 20 with a stable assembly effect, thereby enabling the present disclosure to better satisfy actual application requirements.

Figure 12:
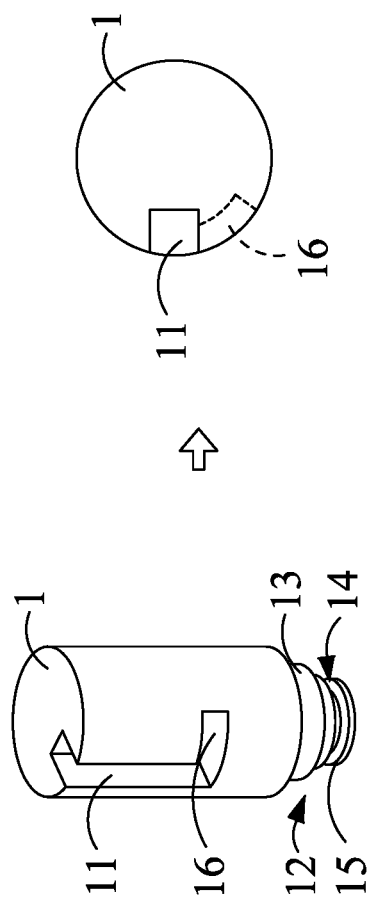
FIG. 12 is a schematic diagram of an appearance of an engaging connection structure according to a fifth embodiment of the present disclosure.

As shown in FIG. 12, in one embodiment of the present disclosure, a difference from the above embodiments is that, the engaging connection structure 1 further includes a rotating insert portion 16, and the vertical insert portion 11 is in communication with the rotating insert portion 16. Thus, the insert (not shown) can be first inserted vertically into the vertical insert portion 11 and then be inserted horizontally or rotationally into the rotating insert portion 16, thereby enabling the present disclosure to better satisfy actual application requirements.

Figure 13:
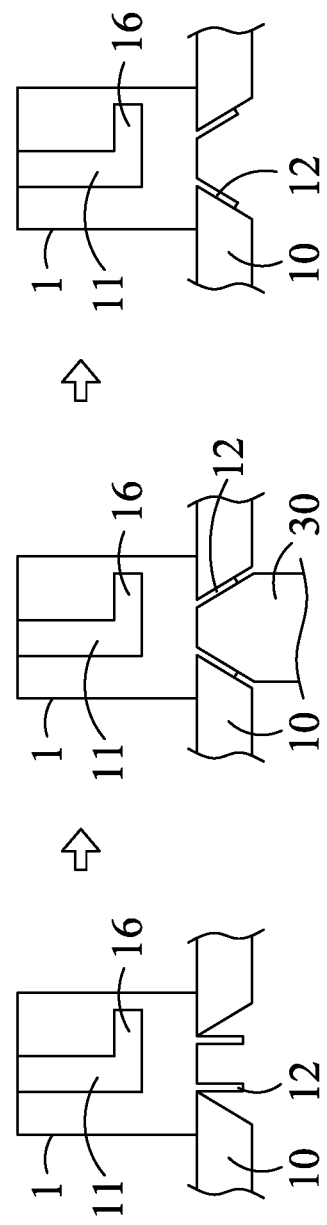
FIG. 13 is a schematic diagram of an engaging connection structure in a state of use according to a sixth embodiment of the present disclosure.

Referring to FIG. 13, in one embodiment of the present disclosure, a difference from the foregoing embodiments is that, the assembly portion 12 is pressed and deformed by a mold 30 and is thus expandingly connected at the object further enabling the assembly portion 12 to be assembled at the object 10 by different assembly modes, thereby enabling the present disclosure to better satisfy actual application requirements.

Figure 14:
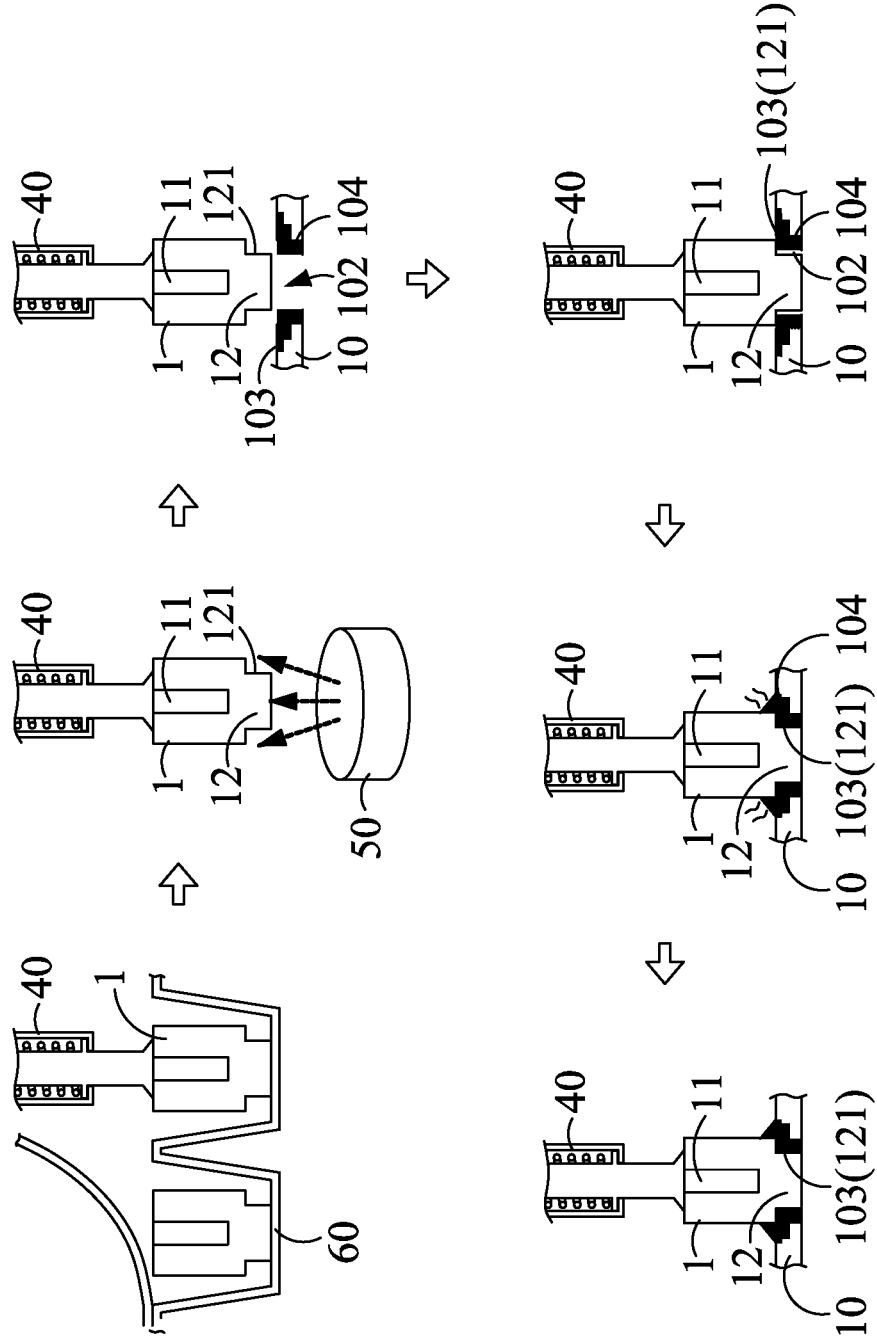
FIG. 14 is a first schematic diagram of an engaging connection structure in a state of use according to a seventh embodiment of the present disclosure.
Figure 15:
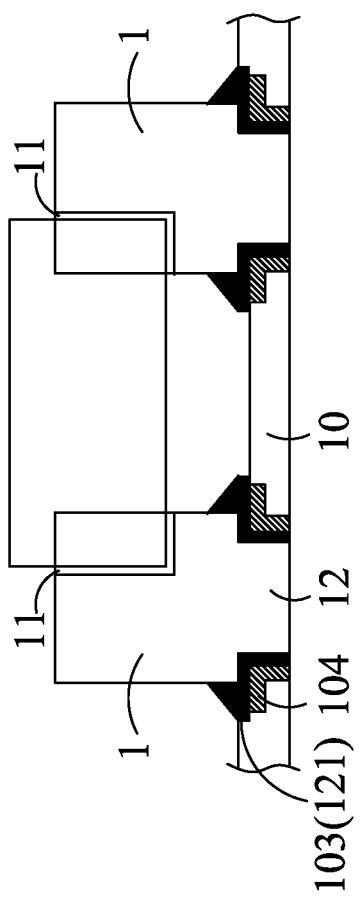
FIG. 15 is a second schematic diagram of an engaging connection structure in the state of use according to the seventh embodiment of the present disclosure.

Referring to FIG. 14 and FIG. 15, in one embodiment of the present disclosure, a difference from the above embodiments is that, during assembly, the engaging connection structure 1 can be picked up from a carrier 60 by a picking tool 40. Once the engaging connection structure 1 is picked up by the picking tool a comparison device 50 is provided to compare the engaging connection structure 1 and an assembly position or an assembly distance of the object 10, and the engaging connection structure 1 is moved to the assembly position of the object by the picking tool 40 according to comparison information of the comparison device 50, and the engaging connection structure 1 is elastically pressed downward by the picking tool 40 at the object 10 (or placed at the object 10), so that the engaging connection structure 1 is assembled at the object 10 via the assembly portion 12.

In one embodiment of the present disclosure, the object 10 has a through hole 102, and the assembly portion 12 of the engaging connection structure 1 is assembled at the through hole 102 of the object 10.

In one embodiment of the present disclosure, the object 10 has a predetermined weldable layer 103, which may be located at a periphery of the through hole 102, and the assembly portion 12 has a weldable surface 121. The comparison device 50 compares the weldable surface 121 of the assembly portion 12 and the position or distance of the predetermined weldable layer 103 at the assembly position of the object 10, and the picking tool 40 moves the engaging connection structure 1 to the predetermined weldable layer 103 of the object 10 according to the comparison information of the comparison device 50.

In one embodiment of the present disclosure, the object 10 is a circuit board; the object 10 has a copper layer 104, and the predetermined weldable layer 103 is provided at the copper layer 104.

On the basis of the above embodiment, the assembly portion 12 of the engaging connection structure 1 can be assembled at the predetermined weldable layer 103 of the object 10 via the weldable surface 121, so as to provide the engaging connection structure 1 and the object 10 with a stable assembly effect, thereby enabling the present disclosure to better satisfy actual application requirements.

Figure 16:
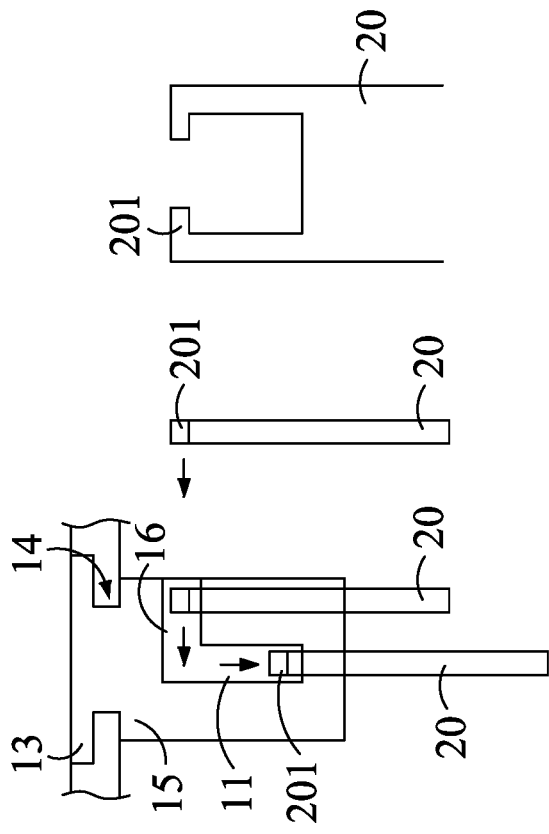
FIG. 16 is a schematic diagram of an engaging connection structure in a state of use according to an eighth embodiment of the present disclosure.

As shown in FIG. 16, in one embodiment of the present disclosure, a difference from the above embodiments is that, the engaging connection structure 1 further includes a rotating insert portion 16 and the vertical insert portion 11 is in communication with the rotating insert portion 16. The insert 20 is first enters horizontally or rotationally the rotating insert portion 16 and is then inserted into the vertical insert portion 11, so as to form a state of engaging connection or fit connection once the insert 20 is inserted. The insert 20 may include a protrusion 201. The protrusion 201 of the insert 20 first enters horizontally or rotationally the rotating insert portion 16, and is then inserted into the vertical insert portion 11. Thus, the engaging connection structure 1 is enabled to provide the object 10 and the insert 20 with a stable assembly effect, thereby enabling the present disclosure to better satisfy actual application requirements.

Figure 17:
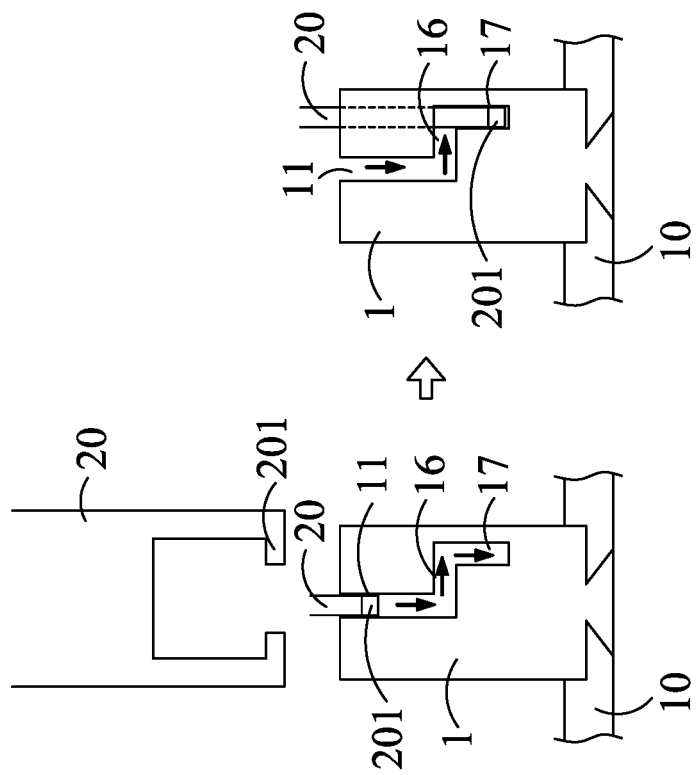
FIG. 17 is a schematic diagram of an engaging connection structure in a state of use according to a ninth embodiment of the present disclosure.

As shown in FIG. 17, in one embodiment of the present disclosure, a difference from the above embodiments is that, the engaging connection structure 1 further includes a rotating insert portion 16 and another vertical insert portion 17. The vertical insert portion 11 is in communication with the rotating insert portion 16, and the rotating insert portion 16 is in communication with the another vertical insert portion 17. The protrusion 201 of the insert 20 may be first inserted into the vertical insert portion 11, be inserted horizontally or rotationally into the rotating insert portion 16, and then be inserted into the another vertical insert portion 17. Thus, the engaging connection structure 1 is enabled to provide the object 10 and the insert 20 with a stable assembly effect, thereby enabling the present disclosure to better satisfy actual application requirements.

Figure 18:
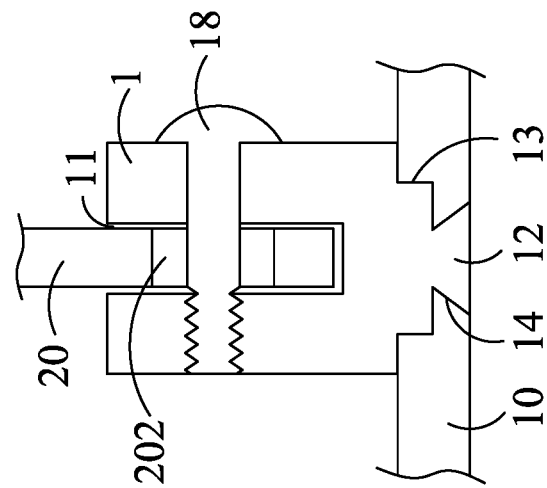
FIG. 18 is a schematic diagram of an engaging connection structure in a state of use according to a tenth embodiment of the present disclosure.

Referring to FIG. 18 and FIG. 19, in one embodiment of the present disclosure, a difference from the above embodiment is that, the engaging connection structure 1 includes an engaging member 18. The engaging member 18 is movably assembled with the engaging connection structure 1, and is configured to be inserted into an inserted portion 202 of the insert 20. Thus, the engaging connection structure 1 is enabled to provide the object 10 and the insert 20 with a stable assembly effect by using the engaging member 18, thereby enabling the present disclosure to better satisfy actual application requirements.

In one embodiment of the present disclosure, the engaging member 18 may be a column (as part a in FIG. 19), an outer fastener (as part b in FIG. 19), a threaded body (as part c in FIG. 19), an elastic fastener (as part d in FIG. 19) or an inner fastener (as part e in FIG. 19). Thus, the engaging connection structure 1 is enabled to provide the object 10 and the insert 20 with a stable assembly effect by using the engaging member 18, thereby enabling the present disclosure to better satisfy actual application requirements.

Referring to FIG. 20, in one embodiment of the present disclosure, a difference from the above embodiments is that, the engaging member 18 has an elastic element 19. One end of the elastic element 19 presses against the engaging connection structure 1, and the other end of the elastic element 19 presses against the engaging member 18. Thus, the engaging member 18 can be pulled with the coordination of the elastic element 19, so as to insert the engaging member 18 into the inserted portion 202 of the insert 20, or to remove the engaging member 18 from the inserted portion 202 of the insert 20. Accordingly, the engaging connection structure 1 is enabled to provide the object 10 and the insert 20 with a stable assembly effect by using the engaging member 18, thereby enabling the present disclosure to better satisfy actual application requirements.

Figure 22:
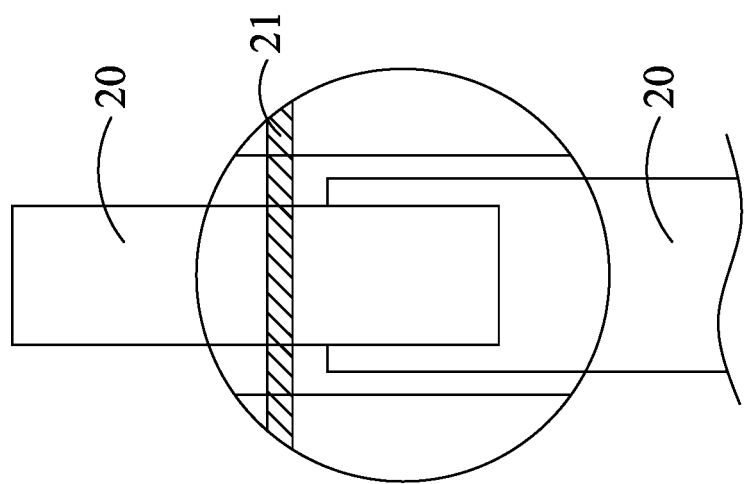
FIG. 22 is a second schematic diagram of an engaging connection structure in the state of use according to the twelfth embodiment of the present disclosure.

Referring to FIG. 21 and FIG. 22, in one embodiment of the present disclosure, a difference from the above embodiment is that, the engaging connection structure 1 includes a push member 2, which presses against the insert 20. The push member 2 is movably arranged at the vertical insert portion 11 by a bolted portion 21, so that the insert 20 presses against the push member 2 when inserted into the vertical insert portion 11, and the push member 2 can be moved to remove the insert 20 from the vertical insert portion 11 as needed, thereby enabling the present disclosure to better satisfy actual application requirements.

Figure 24:
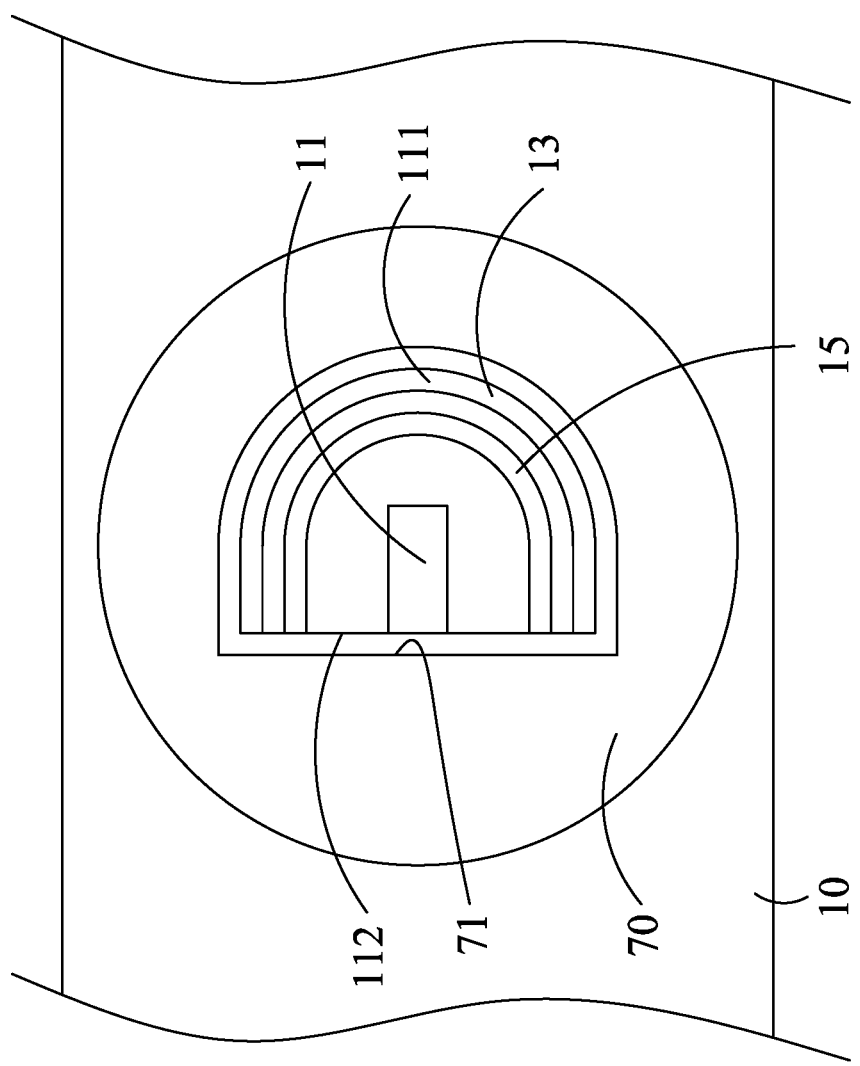
FIG. 24 is a second schematic diagram of an engaging connection structure in the state of use according to the thirteenth embodiment of the present disclosure.

As shown in FIG. 23 and FIG. 24, in one embodiment of the present disclosure, a difference from the above embodiments is that, the engaging connection structure 1 includes a body 111. The body 111 is provided with a restricting portion 112, the restricting portion 112 corresponds to a corresponding restricting portion 71 of a mold 70, and the corresponding restricting portion 71 and the restricting portion 112 are configured for corresponding limiting or anti-rotation.

Thus, the body 111 can be arranged at the mold 70 (the mold 70 at the lower part of FIG. 23) to configure the corresponding restricting portion 71 and the restricting portion 112 for corresponding limiting or anti-rotation, so as to restrict the engaging connection structure 1 in a predetermined direction. The object 10 is then pressurized by a mold 30 (the mold 30 at the upper part of FIG. 23) such that the object 10 is pressurized by the pressurizing portion 13 to cause the material of the object 10 to flow into or enter the material storage space 14, hence completing the assembly of the engaging connection structure 1 and the object 10.

Figure 25:
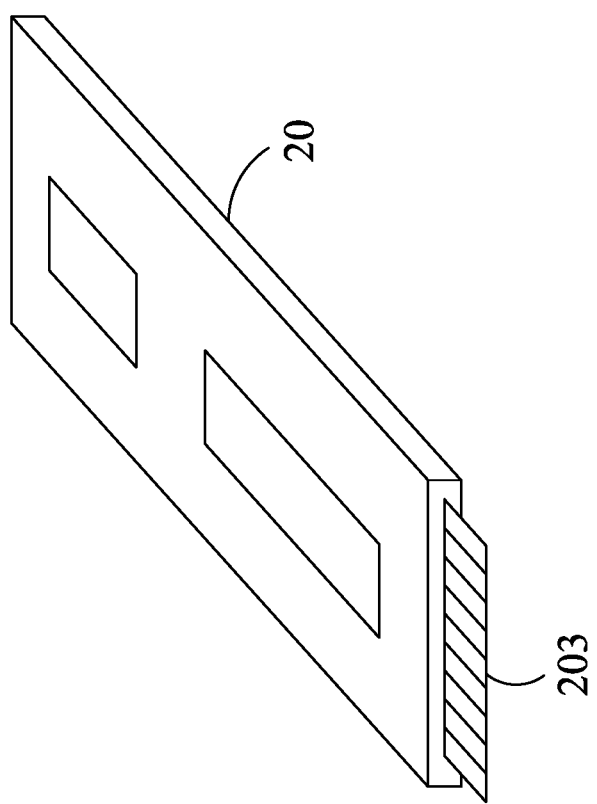
FIG. 25 is a schematic diagram of an insert of an engaging connection structure of the present disclosure.

Referring to FIG. 25, in one embodiment of the present disclosure, a difference from the above embodiments is that, the insert 20 may be a circuit board, a metal board, a plastic board, a board card, a printed circuit board (PCB), an M.2 card, an E1.S card, an NIC card, an integrated circuit (IC), a chip, a memory card, a cooling fin, cooling card, a heat sink, or an electronic device having a heat sink. In this embodiment, the insert 20 is a circuit board and includes a chip and a connector 203.

Refer to FIG. 26 and FIG. 27, in one embodiment of the present disclosure, a difference from the above embodiments is that, the engaging connection structure 1 includes at least one horizontal insert portion 113 and an assembly portion 12. The assembly portion 12 is configured to be assembled at an object 10, and the horizontal insert portion 113 is configured for the insert 20 to be inserted horizontally therein. During use, the engaging connection structure may be assembled at the object 10 via the assembly portion 12, and then the insert 20 (such as the insert 20 above) is inserted horizontally into the horizontal insert portion 113. Thus, the engaging connection structure 1 is enabled to provide the object and the insert with a stable assembly effect. Moreover, in this embodiment, the vertical insert portion 11 may also be additionally provided so as to communicate with the horizontal insert portion 113, thereby enhancing the assembly diversity. In addition, in this embodiment, one surface of the horizontal rectangular engaging structure is arranged with the horizontal insert portion 113; however, the horizontal insert portion 113 may also be arranged on a circumferential surface of a horizontal cylindrical engaging connection structure or a circumferential surface of the vertical cylindrical engaging connection structure 1 (as shown in FIG. 1), and then be communicated with the vertical insert portion 11 or the rotating insert portion 16 of the embodiments above to enhance the assembly diversity. Similarly, the vertical cylindrical engaging connection structure 1 of the above embodiments can also be additionally provided with the horizontal insert portion 113 so as to communicate with the vertical insert portion 11 or the rotating insert portion 16 of the above embodiments, thereby enhancing the assembly diversity. Moreover, the vertical insert portion 11 in the above embodiment is arranged on the circumferential surface of the vertical cylindrical engaging connection structure 1; however, the vertical insert portion 11 may also be arranged on one surface of the rectangular engaging connection structure or on one surface of the horizontal rectangular engaging connection structure 1 (as shown in FIG. 26) and then be communicated with the horizontal insert portion 113, thereby enhancing the assembly diversity. In addition, other types of application of the engaging connection structure 1 of the above embodiments are also suitable for the engaging connection structure 1 of the embodiment, and such details are omitted herein.

The present invention is described by way of the preferred embodiments above. A person skilled in the art should understand that, these embodiments are merely for describing the present invention and are not to be construed as limitations to the scope of the present invention. It should be noted that all equivalent changes, replacements and substitutions made to the embodiments are to be encompassed within the scope of the present invention. Therefore, the scope of protection of the present invention should be accorded with the broadest interpretation of the appended claims.

What is claimed is:

1. An engaging connection structure, comprising at least one vertical insert portion and an assembly portion, wherein the assembly portion is configured to be assembled at an object, and the vertical insert portion is configured for an insert with an inserted portion to be inserted vertically therein; and
   an engaging member, movably assembled with the engaging connection structure, the engaging member is configured to be inserted into the inserted portion of the insert within the vertical insert portion,
      wherein the insert is a circuit board, a metal board, a plastic board, a board card, a printed circuit board (PCB), an M.2 card, an E1.S card, an NIC card, an integrated circuit (IC), a chip, a memory card, a cooling fin, cooling card, a heat sink, or an electronic device having a heat sink.

2. An engaging connection structure, comprising at least one vertical insert portion and an assembly portion, wherein the assembly portion is configured to be assembled at an object, and the vertical insert portion is configured for an insert with an inserted portion to be inserted vertically therein; and
   an engaging member, movably assembled with the engaging connection structure, the engaging member is configured to be inserted into the inserted portion of the insert within the vertical insert portion;
   wherein the engaging connection structure comprises a restricting portion, wherein the restricting portion is configured to correspondingly limit a corresponding restricting portion of the object, or the restricting portion is an anti-rotation portion that is configured to anti-rotate, limit or restrict a direction or to restrict an engaging connection direction of the engaging member, or the restricting portion restricts an inserting direction of the insert, or the restricting portion restricts a motion direction of the insert, or the restricting portion restricts a direction of the vertical insert portion, or the restricting portion restricts a direction of the horizontal insert portion.

3. The engaging connection structure according to claim 1, further comprising a rotating insert portion, wherein the vertical insert portion is in communication with the rotating insert portion.

4. The engaging connection structure according to claim 1, further comprising a rotating insert portion or another vertical insert portion, or the vertical insert portion is in communication with the rotating insert portion, or the rotating insert portion is in communication with the another vertical insert portion.

5. The engaging connection structure according to claim 1, comprising an elastic element, wherein the engaging member is configured to be inserted into the insert, the engaging member is a column, an outer fastener, a threaded body, an elastic fastener or an inner fastener, the engaging member is movably assembled with the engaging connection structure, or the engaging member comprises an elastic element, one end of the elastic element presses against the engaging connection structure, and the other end of the elastic element presses against the engaging member.

6. The engaging connection structure according to claim 1, further comprising a rotating insert portion, wherein the vertical insert portion is in communication with the rotating insert portion, the insert comprises a protrusion, the protrusion is configured to be first inserted into the vertical insert portion and then horizontally or rotationally inserted into the rotating insert portion.

7. The engaging connection structure according to claim 1, wherein a protrusion of the insert horizontally or rotationally enters a rotating insert portion and or is then inserted into the vertical insert portion.

8. The engaging connection structure according to claim 1, comprising a push member, wherein the push member presses against the insert, or the push member is movably arranged at the vertical insert portion by a bolted portion, or the insert presses against the push member when inserted into the vertical insert portion, or the push member is moved to remove the insert from the vertical insert portion.

9. The engaging connection structure according to claim 1, comprising a body, wherein the body is provided with a restricting portion, the restricting portion corresponds to a corresponding restricting portion of a mold, and the corresponding restricting portion and the restricting portion are configured for corresponding limiting or anti-rotation.

10. An engaging connection method of an engaging connection structure, engagingly connecting the engaging connection structure of claim 1, the engaging connection structure comprising at least one vertical insert portion and an assembly portion, the method comprising: assembling the assembly portion at an object, and inserting vertically an insert into the vertical insert portion; or the engaging connection structure comprising at least one horizontal insert portion, the method comprising assembling the engaging connection structure at an object and inserting horizontally an insert into the horizontal insert portion.

11. An engaging connection structure, comprising at least one vertical insert portion and an assembly portion, wherein the assembly portion is configured to be assembled at an object, and the vertical insert portion is configured for an insert with an inserted portion to be inserted vertically therein; and an engaging member, movably assembled with the engaging connection structure, the engaging member is configured to be inserted into the inserted portion of the insert within the vertical insert portion, wherein the engaging connection structure further comprised a pressurizing portion, a material storage space and a restricting portion; wherein, the pressurizing portion is configured to apply a pressure on an object to cause a material of the object to flow into or enter the material storage space so as to limit the engaging connection structure at the object; or the assembly portion is configured to be pressurized by an object so that a material of the object is limited or fit connected at the assembly portion to restrict the engaging connection structure at the object by the assembly portion; or the engaging connection structure further comprises a weldable surface, which is configured to be heated and welded so that the engaging connection structure is welded at the object; or the engaging connection structure further comprises a lock connection portion or an engaging connection portion so that the engaging connection structure is assembled at the object.

* * * * *